(12) United States Patent
Tamagaki et al.

(10) Patent No.: US 9,133,547 B2
(45) Date of Patent: Sep. 15, 2015

(54) PLASMA CVD APPARATUS

(75) Inventors: Hiroshi Tamagaki, Takasago (JP);
Tadao Okimoto, Takasago (JP); Toshiki Segawa, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 811 days.

(21) Appl. No.: 13/395,800

(22) PCT Filed: Oct. 1, 2010

(86) PCT No.: PCT/JP2010/005914
§ 371 (c)(1),
(2), (4) Date: Mar. 13, 2012

(87) PCT Pub. No.: WO2001/043047
PCT Pub. Date: Apr. 14, 2011

(65) Prior Publication Data
US 2012/0174864 A1    Jul. 12, 2012

(30) Foreign Application Priority Data
Oct. 5, 2009  (JP) ................. 2009-231548

(51) Int. Cl.
*C23F 1/00* (2006.01)
*H01L 21/306* (2006.01)
(Continued)

(52) U.S. Cl.
CPC ........... *C23C 16/503* (2013.01); *C23C 16/4412* (2013.01); *C23C 16/50* (2013.01);
(Continued)

(58) Field of Classification Search
CPC .... C23C 16/50; C23C 16/503; C23C 16/505; C23C 16/509; C23C 16/54
USPC ................. 118/723 E, 718, 719; 156/345.31, 156/345.43–345.46
See application file for complete search history.

(56) References Cited

U.S. PATENT DOCUMENTS 4,767,516 A * 8/1988 Nakatsuka et al. ...... 204/192.14
5,047,131 A * 9/1991 Wolfe et al. .............. 204/192.23
(Continued)

FOREIGN PATENT DOCUMENTS

EP     0 871 159 A2    10/1998
EP     0 871 159 A3    10/1998
(Continued)

OTHER PUBLICATIONS

International Search Report issued on Nov. 16, 2010 in PCT/JP10/005914 filed on Oct. 1, 2010.
(Continued)

*Primary Examiner* — Rudy Zervigon
(74) *Attorney, Agent, or Firm* — Oblon, McClelland, Maier & Neustadt, L.L.P.

(57) ABSTRACT

The disclosed plasma CVD apparatus (1) is provided with a vacuum chamber (3); a pair of deposition rollers (2, 2) disposed within the vacuum chamber (3) that are connected to both poles of an AC power supply and around which a substrate (W) is wound; a gas-supplying device (5) that supplies process gas containing a source gas to a deposition zone (D) which is a portion of or all of the region that is on one side of a line linking the centers of rotation of the pair of deposition rollers (2, 2); and a magnetic-field-generating device (7) that, by means of the AC power supply being applied to each of the deposition rollers (2, 2), forms a magnetic field that causes the source gas in a predetermined region to become plasma. The magnetic-field-generating device (7) causes the source gas in the region adjacent to the surface of the portion of the pair of deposition rollers (2, 2) located within the deposition zone (D) to become plasma, forming a plasma region (P). The substrate (W) is wound around the pair of deposition rollers (2, 2) so as to pass through the plasma region (P).

13 Claims, 9 Drawing Sheets

(51) Int. Cl.
  *C23C 16/503* (2006.01)
  *C23C 16/50* (2006.01)
  *C23C 16/505* (2006.01)
  *C23C 16/509* (2006.01)
  *C23C 16/54* (2006.01)
  *C23C 16/44* (2006.01)
  *H01J 37/32* (2006.01)
  *H05H 1/24* (2006.01)

(52) U.S. Cl.
  CPC ............ *C23C 16/505* (2013.01); *C23C 16/509* (2013.01); *C23C 16/54* (2013.01); *C23C 16/545* (2013.01); *H01J 37/32036* (2013.01); *H01J 37/3266* (2013.01); *H01J 37/3277* (2013.01); *H01J 37/32366* (2013.01); *H01J 37/32513* (2013.01); *H05H 1/24* (2013.01)

(56) References Cited

U.S. PATENT DOCUMENTS

| | | | | |
|---|---|---|---|---|
| 5,096,562 A * | 3/1992 | Boozenny et al. | ....... | 204/298.22 |
| 5,171,411 A * | 12/1992 | Hillendahl et al. | ....... | 204/192.12 |
| 5,224,441 A | 7/1993 | Felts et al. | | |
| 5,364,518 A * | 11/1994 | Hartig et al. | ............. | 204/298.22 |
| 5,437,725 A * | 8/1995 | Schuster et al. | ............... | 118/718 |
| 5,618,388 A * | 4/1997 | Seeser et al. | ............. | 204/192.12 |
| 5,743,966 A * | 4/1998 | Woolley et al. | ............... | 118/718 |
| 5,814,195 A * | 9/1998 | Lehan et al. | ............. | 204/192.12 |
| 6,040,052 A | 3/2000 | Kanazawa et al. | | |
| 6,044,792 A * | 4/2000 | Ogawa et al. | ............. | 118/723 E |
| 6,375,814 B1 * | 4/2002 | De Bosscher et al. | ... | 204/298.21 |
| 6,399,159 B1 * | 6/2002 | Grace et al. | ................... | 427/536 |
| 6,911,779 B2 * | 6/2005 | Madocks | ................. | 315/111.21 |
| 7,025,856 B2 * | 4/2006 | Selwyn et al. | ........... | 156/345.43 |
| 7,157,123 B2 * | 1/2007 | Hartig | .......................... | 427/571 |
| 7,294,283 B2 * | 11/2007 | Madocks | ........................ | 216/67 |
| 7,811,669 B2 * | 10/2010 | Fujii et al. | ..................... | 428/451 |
| 7,897,025 B2 * | 3/2011 | Inoue et al. | ............... | 204/298.21 |
| 7,932,678 B2 * | 4/2011 | Madocks | ................. | 315/111.21 |
| 8,303,714 B2 * | 11/2012 | Tamagaki | ..................... | 118/718 |
| 8,349,084 B2 * | 1/2013 | Johnson et al. | ............... | 118/718 |
| 8,900,428 B2 * | 12/2014 | Crowley et al. | ........... | 204/298.21 |
| 2004/0135485 A1 * | 7/2004 | Madocks | .................... | 313/359.1 |
| 2004/0155592 A1 * | 8/2004 | Madocks | ................. | 315/111.21 |
| 2005/0136694 A1 * | 6/2005 | Inoue et al. | ................... | 438/795 |
| 2007/0039666 A1 * | 2/2007 | Hayashi et al. | ............... | 148/279 |
| 2009/0061109 A1 * | 3/2009 | Yamauchi et al. | ........... | 427/579 |
| 2009/0098311 A1 * | 4/2009 | Aomine et al. | ............ | 427/576 |
| 2009/0277778 A1 * | 11/2009 | Stowell et al. | ........... | 204/192.12 |
| 2010/0313810 A1 * | 12/2010 | Tamagaki | ..................... | 118/718 |
| 2012/0164353 A1 * | 6/2012 | Madocks | ..................... | 427/576 |
| 2012/0174864 A1 * | 7/2012 | Tamagaki et al. | .............. | 118/718 |
| 2013/0133577 A1 * | 5/2013 | Tamagaki et al. | .............. | 118/718 |
| 2013/0186334 A1 * | 7/2013 | Okimoto et al. | .............. | 118/718 |
| 2013/0269610 A1 * | 10/2013 | Tamagaki et al. | ......... | 118/723 R |
| 2013/0337602 A1 * | 12/2013 | Martinson et al. | .............. | 438/95 |

FOREIGN PATENT DOCUMENTS

| | | |
|---|---|---|
| EP | 1 787 796 A1 | 5/2007 |
| EP | 2 119 811 A1 | 11/2009 |
| EP | 2 418 081 A1 | 2/2012 |
| JP | 3 155278 | 7/1991 |
| JP | 3 183782 | 8/1991 |
| JP | 10 289445 | 10/1998 |
| JP | 2002-367847 | 12/2002 |
| JP | 3 880697 | 2/2007 |
| JP | 2008 196001 | 8/2008 |
| WO | WO 2008/099630 A1 | 8/2008 |

OTHER PUBLICATIONS

U.S. Appl. No. 13/393,382, filed Feb. 29, 2012, Segawa, et al.
Extended European Search Report issued May 27, 2015 in Application No. 10821724.1.

* cited by examiner

F I G . 3
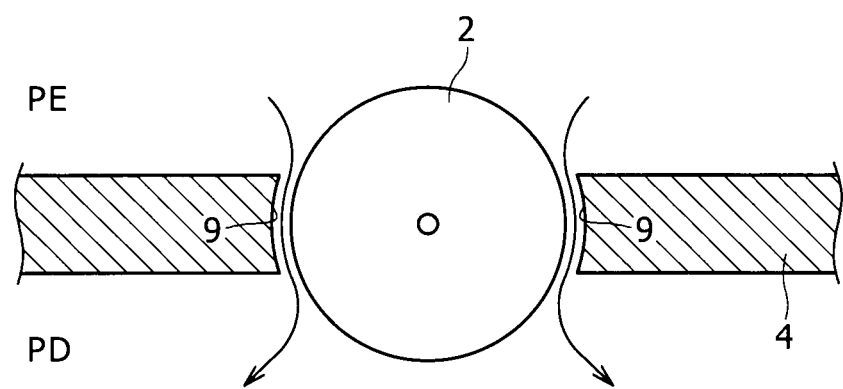

PLASMA CVD APPARATUS

TECHNICAL FIELD

The present invention relates to a plasma CVD apparatus for continuously depositing a functional coating on a surface of a sheet shape continuous substrate such as a plastic film.

BACKGROUND ART

In recent years, a plastic film used for packaging food is strongly required to have a vapor and oxygen-proof characteristic (barrier property). Thus, a substrate such as the plastic film is sometimes coated with a transparent SiOx coating in order to provide a high barrier property, and a coating method with high productivity is desired.

As a coating technique of the SiOx coating, conventionally, there are vacuum vapor deposition methods and physical vapor deposition methods (PVD methods) such as a sputtering method. There is also a plasma CVD method serving as an advantageous technique in terms of deposition speed and deposition of a high barrier coating in comparison to these techniques.

As an apparatus using the plasma CVD method for depositing a coating on a surface of a sheet shape substrate, there are apparatuses described in Patent Documents 1 to 3.

The apparatus described in Patent Document 1 is provided with a chamber capable of reducing pressure, and a means for generating plasma in the chamber. The plasma generating means has a contacting and exposing means having an electrode (deposition roller) forming a plasma-facing surface in the chamber, and a confining means provided with a grounded shield (counter electrode) arranged at a position facing the plasma-facing surface of the above electrode and a magnet for generating a magnetic field in which plasma is confined between the grounded shield and the deposition roller. In this plasma processing apparatus, by applying a voltage between the counter electrode and the deposition roller in a state that a source gas is supplied, a glow discharge is generated and the plasma is produced. By causing a film existing on a surface of the deposition roller to pass through in this plasma, a coating layer of SiOx or the like is deposited.

The apparatus described in Patent Document 2 is a magnetron plasma CVD apparatus for depositing a coating while taking up a substrate. In this apparatus, a main roller (deposition roller) serving as a deposition portion and an anode (counter electrode) are arranged so as to face each other in a vacuum chamber, and a magnetic circuit is provided inside the main roller. In this apparatus, plasma is generated on the substrate traveling on the main roller so as to deposit the coating.

The apparatus described in Patent Document 3 is a plasma CVD apparatus for depositing a coating on a surface of a substrate while continuously conveying the substrate in a vacuum chamber. This apparatus has a pair of deposition rollers arranged so as to face each other in parallel or substantially in parallel in such a manner that wound parts of the substrate face each other, magnetic field generating members provided inside the deposition rollers for generating magnetic fields expanded in the vicinity of surfaces of the rollers facing a facing space between the deposition rollers, a plasma power supply in which polarity is reversed between one pole and the other pole, a gas supplying means for supplying a process gas G to the facing space, and a vacuuming means for vacuuming the facing space. The one pole of the plasma power supply is connected to one of the deposition rollers, and the other pole is connected to the other deposition roller.

However, in the plasma processing apparatus disclosed in Patent Document 1, there is a disadvantage that the coating is also formed and deposited on a surface of the counter electrode in contact with the plasma. The insulating coating deposited and grown on the counter electrode covers the surface of the electrode so as to change a characteristic of a glow discharge. Since the coating is deposited on a part other than the film, the source gas is wasted. In addition, the coating deposited by a long-time operation is peeled off from the counter electrode, and this peeled-off coating (coating flake) is attached to a surface of the film so as to cause a coating defect (contamination).

In the CVD apparatus disclosed in Patent Document 2, the counter electrode is installed around the deposition roller around which the film is wound. Thus, a problem that the coating is deposited on the counter electrode is generated as well as the plasma processing apparatus disclosed in Patent Document 1, and an improvement measure is not disclosed.

The plasma CVD apparatus disclosed in Patent Document 3 can solve the "problems caused by contamination of the counter electrode" existing in the apparatuses disclosed in Patent Documents 1 and 2.

That is, in this plasma CVD apparatus, the plasma is generated between the pair of deposition rollers placed side by side in such a manner that axes thereof are parallel to each other, and the coating is deposited on the surface of the film wound around the deposition rollers. Thus, a counter electrode does not exist near the deposition rollers. Therefore, a change in the characteristic of the discharge and generation of the coating flake caused by the deposition on the counter electrode are suppressed, so that long-time stable deposition can be performed.

However, even in the plasma CVD apparatus of Patent Document 3, parts not covered with the film (substrate) exist in both ends in the axial direction of the deposition rollers, and coating deposition on the parts is generated. In this plasma CVD apparatus, the plasma is respectively generated at positions in which the surfaces of the deposition rollers face each other, and the coating is deposited on the film by this plasma. Thus, deposition regions (regions where the plasma is generated) face each other. Therefore, when the coating deposited on one of the deposition rollers is scattered as the coating flake, this coating flake is scattered in the direction of the film wound around the facing other deposition roller and easily attached to this film.

CITATION LIST

Patent Document

Patent Document 1: Japanese Patent No. 3155278 (FIG. 2)
Patent Document 2: Japanese Patent No. 3880697 (FIG. 3)
Patent Document 3: Japanese Unexamined Patent Application Publication No. 2008-196001 (FIG. 2)

DISCLOSURE OF THE INVENTION

The present invention is achieved in consideration with such problems, and an object thereof is to provide a plasma CVD apparatus capable of avoiding generation of coating defects on a substrate to be deposited even when a problem of peeling-off of the coating deposited on members other than the substrate happens.

A plasma CVD apparatus according to the present invention is a plasma CVD apparatus for depositing a coating on a surface of a sheet shape continuous substrate, including a vacuum chamber, a pair of deposition rollers disposed in the vacuum chamber and connected to both poles of an AC power supply, the deposition rollers around which the substrate is wound, a gas supplying device for supplying a gas containing a source gas to a deposition zone serving as one part of or all of a region on one side of a line connecting rotation centers of the pair of deposition rollers, and a magnetic field generating device for generating magnetic fields in which plasma of the source gas is generated in a predetermined region by respectively applying the AC voltage to the deposition rollers by the AC power supply, wherein the magnetic field generating device causes the source gas in regions adjacent to surfaces of parts of the pair of deposition rollers positioned in the deposition zone to become the plasma so as to form plasma regions, and the substrate is wound around the pair of deposition rollers so as to pass through the plasma regions. It should be noted that the process gas is formed by mixing the source gas forming the coating and serving as an essential with a reactive gas reacting with the source gas so as to form a chemical compound and an auxiliary gas not being contained in the coating but contributing to plasma generation, coating quality improvement, and the like, if necessary.

According to this plasma CVD apparatus, a counter electrode does not exist around the deposition rollers. Thus, a change in a characteristic of a discharge caused by the deposition on the counter electrode is suppressed, and a coating flake is not generated.

Moreover, since the deposition zone is formed in the region on the one side of the line connecting the rotation centers of the pair of deposition rollers arranged in parallel, the coating flake scattered from one of the deposition rollers does not easily reach the film on the other deposition roller. Specifically, since the deposition zone is formed in the region on the one side of the line connecting the rotation centers, in comparison to a case where plasma regions are formed at facing positions of the surfaces of the deposition rollers, a distance between the plasma regions formed on the surfaces of the deposition rollers is increased, and deposition surfaces of the film are not placed at the facing positions. Therefore, even when the coating flake is scattered from one of the deposition rollers, the coating flake does not easily reach the film on the other deposition roller in comparison to a case where the plasma is generated at the facing positions of the deposition rollers. Thereby, generation of contamination due to scatter of the coating flake can be suppressed.

BRIEF DESCRIPTION OF THE DRAWINGS

[FIG. 3] An enlarged view showing a blocking means provided in the plasma CVD apparatus.

MODES FOR CARRYING OUT THE INVENTION

Figure 1:
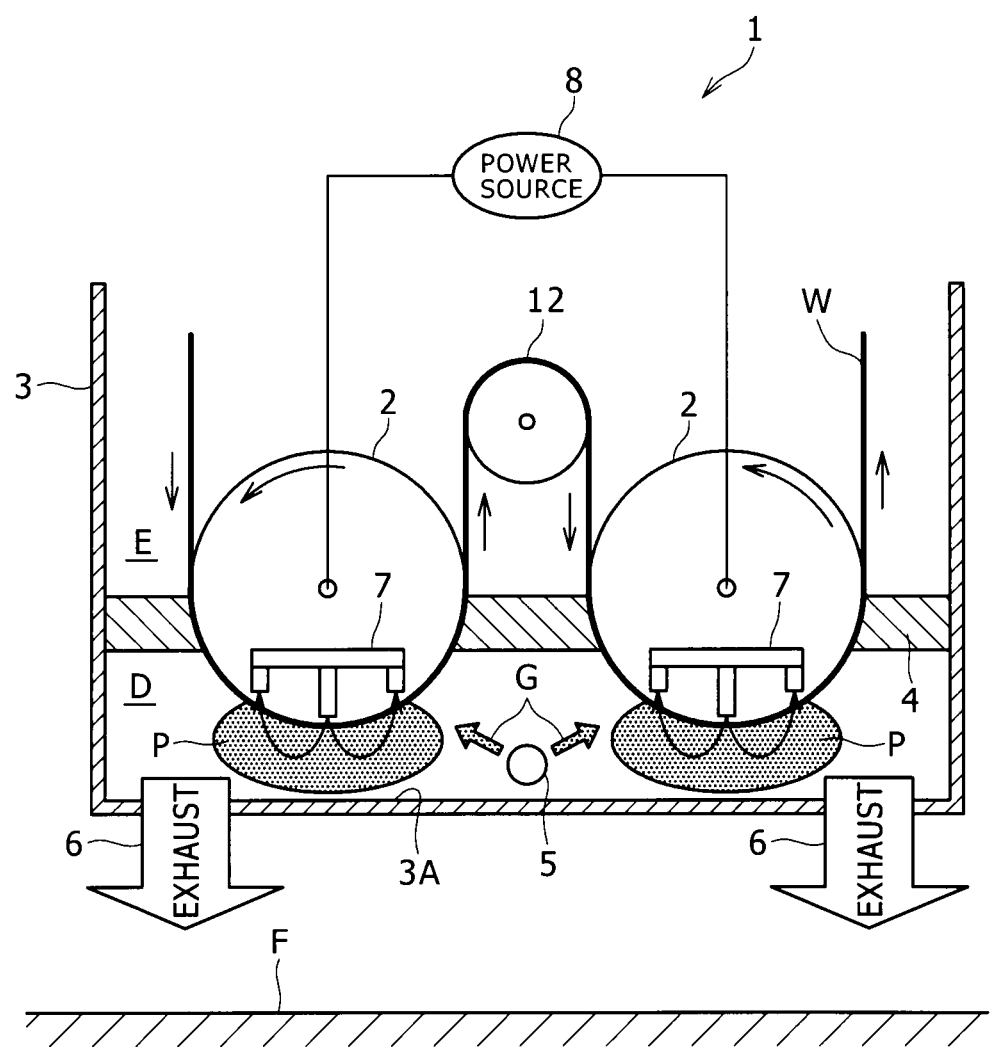
[FIG. 1] A view schematically showing a first embodiment of a plasma CVD apparatus.

Hereinafter, embodiments of the present invention will be described based on the drawings.

It should be noted that the same parts will be given the same reference numerals in the following description. Names and functions of those parts are also the same. Therefore, detailed description of those parts will not be repeated.

[First Embodiment]

FIG. 1 shows an entire configuration of a plasma CVD apparatus 1 according to a first embodiment of the present invention.

In the plasma CVD apparatus 1 of the present embodiment, an AC voltage or a pulse voltage accompanied by polarity reversal is applied to deposition rollers 2, 2 arranged side by side under reduced pressure, and a glow discharge is generated in spaces on the lower side of the deposition rollers 2, 2, so that a coating is deposited on a sheet shape substrate W wound around the deposition rollers 2, 2 by plasma CVD.

The plasma CVD apparatus 1 of the present embodiment is provided with a vacuum chamber 3, and the pair of deposition rollers 2, 2 arranged in this vacuum chamber 3, and deposits the coating on a surface of the sheet shape substrate W wound around this pair of deposition rollers 2, 2.

A blocking member 4 partitioning an interior of the vacuum chamber 3 into the upper and lower sides (a lower surface of the blocking member 4) is provided on the lower side of a line connecting rotation centers of the pair of deposition rollers 2, 2. In the vacuum chamber 3, the lower side of this blocking member 4 is a deposition zone D, and the upper side of the blocking member 4 is a non-deposition zone E.

In the deposition zone D, a gas supplying portion 5 of a gas supplying device for supplying a process gas to the deposition zone D, and pump systems 6 for exhausting the deposition zone D are provided. In addition, magnetic field generating means 7 for generating plasma in parts of surfaces of the pair of deposition rollers 2, 2 positioned in the deposition zone D (in detail, regions adjacent to the parts) so as to form plasma regions P are provided. The substrate W is wound around the pair of deposition rollers 2, 2 so as to pass through the plasma regions P formed by the magnetic field generating means 7.

As the substrate W on which the coating is deposited, an insulating material capable of being taken up into a roll shape such as a plastic film, sheet, or paper is considered. As the plastic film or sheet, PET, PEN, PES, polycarbonate, polyolefin, polyimide, and the like are appropriate. Thickness of the substrate W is preferably 5 μm to 0.5 mm with which the substrate can be conveyed in vacuum.

Based on FIGS. 1 and 2, a detail of the plasma CVD apparatus 1 will be described.

The vacuum chamber 3 is constructed by welding a stainless steel plate or the like. The pair of deposition rollers 2, 2 is disposed inside this vacuum chamber 3. As shown in FIGS. 1 and 2, the pair of deposition rollers 2, 2 has a cylindrical shape with the same diameter and the same length, and is constructed by a stainless steel or the like. In order to make rotation centers thereof have the substantially same height from a floor surface F, the pair of deposition rollers 2, 2 is disposed in such a manner that axes thereof (the rotation centers) are parallel to each other side by side in the horizontal direction.

The pair of deposition rollers 2, 2 is electrically insulated from the vacuum chamber 3, electrically insulated from each other, and connected to both poles of an AC power supply 8. This AC power supply 8 generates an AC voltage of a high frequency or a pulse shape voltage in which polarities of both the electrodes are reversible.

The substrate W on which the coating is deposited is an insulating material as described above. Thus, an electric current cannot flow through the substrate upon application of a DC voltage, and an electric power applied to the deposition rollers 2, 2 cannot be transmitted to the plasma. However, with an AC electric power of an appropriate frequency (about 1 kHz or more, preferably, 10 kHz or more), an electric power applied to the deposition rollers 2, 2 can be propagated to the plasma through the insulating substrate W. A voltage of the discharge generated in each deposition roller upon application of a voltage by the AC power supply 8 is preferably within a range from hundreds of V to 2,000 V.

The lower surface of the blocking member 4 is positioned on the slightly lower side of the line connecting the rotation centers of the pair of deposition rollers 2, 2, and the blocking member is provided in the vacuum chamber 3 in such a manner that the lower surface partitions the interior of the vacuum chamber 3 into the upper and lower sides. The blocking member 4 is a partition wall made of metal or the like and provided in the horizontal direction in the vacuum chamber 3 in such a manner that the lower surface thereof lies at a position on the lower side of the rotation centers of the deposition rollers 2, 2.

In an inner space of the vacuum chamber 3, the lower side of the blocking member 4 is the deposition zone D in which the coating is deposited, and the upper side of the blocking member 4 is the non-deposition zone E not contributing to the deposition. The process gas (containing a source gas serving as an essential with a reactive gas and an auxiliary gas) contributing to the deposition is supplied to the deposition zone D after pressure reduction. A gas not contributing to the deposition is supplied to the non-deposition zone E after pressure reduction. The source gas is a gas for supplying a material serving as major component of the coating. For example, in a case where a SiOx coating is deposited, a gas containing Si such as HMDSO, TEOS, and silane is the source gas. The reactive gas is a gas not depositing the coating by itself but reacting with the source gas to be taken into the coating. Oxygen ($O_2$) corresponds to the reactive gas in a case of SiOx deposition. The auxiliary gas is a gas not contained in the coating in principle, but a gas to be supplied for purposes of improvement in discharge stability, coating quality improvement, and the like. Ar, He, or the like is used as the reactive gas in a case of the SiOx deposition.

As shown in FIG. 3, clearances 9 (gaps) are provided between the deposition rollers 2, 2 and the blocking member 4. In detail, parts of the blocking member 4 surrounding the deposition rollers 2, that is, the parts of the blocking member 4 close to the surfaces of the deposition rollers 2, 2 are arc portions recessed along outer peripheral surfaces of the deposition rollers 2, 2. The arc portions are not in contact with the surfaces of the deposition rollers 2, 2. The clearances 9 are formed by the gaps between the arc portions and the surfaces of the deposition rollers 2, 2.

The clearances 9 between the deposition rollers 2, 2 and the blocking member 4 have a space distance by which the substrate W wound around the deposition rollers 2, 2 can pass through and gas inflow from the deposition zone D to the non-deposition zone E can be suppressed. For example, gap length of the clearances 9 is preferably 0.5 to 3 mm.

As shown in FIG. 1, in the deposition zone D, the gas supplying portion 5 of the gas supplying device for supplying the process gas G to this zone is provided.

This gas supplying portion 5 is a circular pipe member. A plurality of injection holes for injecting the gas is provided on a peripheral surface of the gas supplying portion 5 along the longitudinal direction. The gas supplying portion 5 is arranged between and on the lower side of the pair of deposition rollers 2, 2 and disposed in such a manner that an axis of the gas supplying portion 5 and the rotation axes of the deposition rollers 2, 2 are substantially parallel to each other.

"Between the pair of deposition rollers 2, 2 in FIG. 1" indicates the inner side of a space between the axes of the pair of deposition rollers 2, 2 in the left and right direction of FIG. 1, and "outside of the pair of deposition rollers 2, 2" indicates the outer sides of the space between the axes of the pair of deposition rollers 2, 2 in the left and right direction of FIG. 1.

It should be noted that the gas supplying portion 5 is highly preferably arranged on the lower side of the plasma regions P as described later. The injection holes provided along the longitudinal direction of the gas supplying portion 5 are formed so as to point to the plasma regions P.

Meanwhile, the pump systems 6 connecting to a vacuum pump are provided in a bottom wall 3A of the vacuum chamber 3. The pump systems 6 reduce pressure of the deposition zone D before a deposition process and discharge the process gas G supplied from the gas supplying portion 5 after contributing to the deposition to an exterior of the vacuum chamber 3.

The pump systems 6 of the present embodiment are provided outside of and on the lower side of the pair of deposition rollers 2, 2. That is, the pump systems 6 are provided on the left lower side of the deposition roller 2 positioned on the left side in FIG. 1, and on the right lower side of the deposition roller 2 positioned on the right side. It should be noted that the pump systems 6 are highly preferably arranged so as to be positioned on the lower side of the plasma regions P described later.

In sum, the pump systems 6, 6 are provided at two points on both the left and right sides in the bottom wall 3A of the vacuum chamber 3, and the gas supplying portion 5 is disposed in substantially center and on the upper side of the bottom wall 3A.

By appropriately controlling the gas supplying portion 5 and the pump systems 6, and controlling a gas supplying portion provided on the side of the non-deposition zone E (a non-deposition zone side gas supplying portion (not shown)) and a pump system (not shown) so as to supply the reactive gas and/or the auxiliary gas, "pressure PD of deposition zone D≤pressure PE of non-deposition zone E" is established. Thereby, a flow of the gas passing through the clearances 9 and going from the non-deposition zone E to the deposition zone D is formed. As a result, the inflow of the source gas to the non-deposition zone E is suppressed. No pump system may be provided in the non-deposition zone E and the reactive gas and/or the auxiliary gas may simply be supplied.

As shown in FIG. 1, in the plasma CVD apparatus 1, the magnetic field generating devices 7 for generating the plasma in regions adjacent to the parts of the surfaces of the pair of deposition rollers 2, 2 positioned in the deposition zone D so as to form the plasma regions P are provided. Since the coating is effectively deposited in the plasma regions P, the plasma regions P can be thought as deposition regions.

In a case of the present embodiment, the magnetic field generating devices 7 are respectively disposed on the inner sides of the deposition rollers 2, 2 so that the plasma regions P are on the surfaces of lower parts of the deposition rollers 2, 2. The magnetic field generating devices 7 are arranged with magnetic poles directed downward in such a manner that generated magnetic lines reach from inner surfaces of the lower parts of the deposition rollers 2, 2 to outer surfaces (the surfaces) of the lower parts and return to the inner sides of the deposition rollers 2, 2 again. The magnetic poles of the magnetic field generating devices 7 are always directed downward even when the deposition rollers 2, 2 are rotated.

The gas supplying portion 5 described above injects the process gas G so as to point to the plasma regions P.

It should be noted that although various modes can be adopted as the magnetic field generating devices 7, the magnetic field generating devices may be a magnetron magnetic field (race-track shape magnetic field) generating mechanism provided with for example, a center magnet elongated in the roller axis direction, a race-track shape (a shape like a race-track of an athletics track field) outer peripheral magnet surrounding this center magnet, and a magnetic field short member connecting these on the inner side of the deposition roller.

In order to reliably deposit the coating on the substrate W, there is a need for moving the substrate W in such a manner that the substrate W passes through the plasma regions P formed by the magnetic field generating devices 7. Therefore, in the plasma CVD apparatus 1 of the present embodiment, a feeding roll 10 and a take-up roll 11 are arranged in the following positional relationship.

Figure 2:
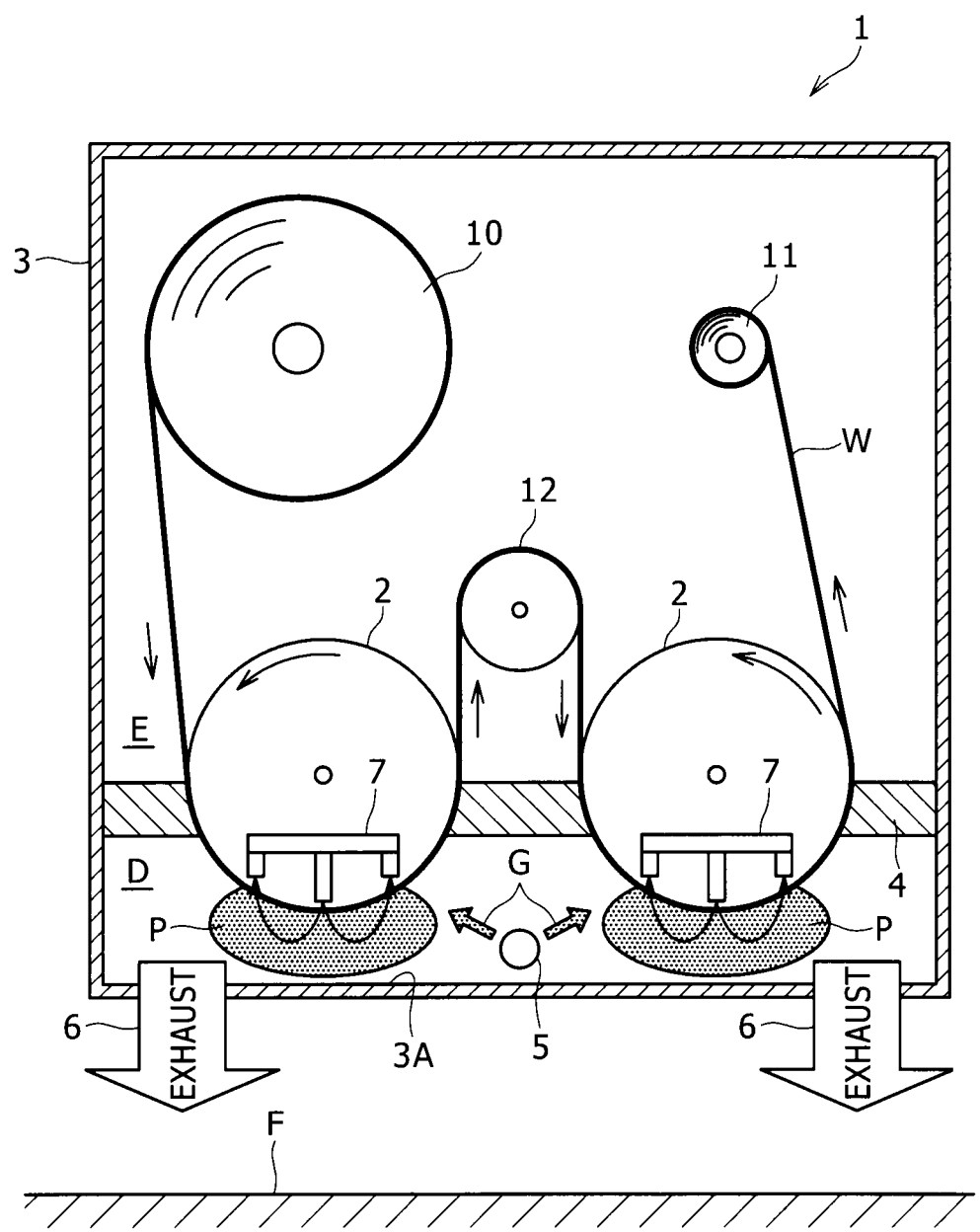
[FIG. 2] A view schematically showing the first embodiment of the plasma CVD apparatus (entire view).

As shown in FIG. 2, the feeding roll 10 for feeding out the wound substrate W on which no coating is deposited yet is disposed on the upper left side in the vacuum chamber 3, and the take-up roll 11 for taking up the substrate W after the deposition is disposed on the upper right side in the vacuum chamber 3. That is, the feeding roll 10 and the take-up roll 11 are provided in the non-deposition zone E.

One auxiliary roller 12 for sending the substrate W passing through one of the deposition rollers 2 to the other deposition roller 2 is provided between and on the upper side of the pair of left and right deposition rollers 2, 2. This auxiliary roller 12 is disposed in the non-deposition zone E.

A procedure of depositing the coating on the substrate W in the plasma CVD apparatus 1 described above will be described.

Firstly, the pump systems 6 are operated so as to reduce the pressure of the deposition zone D before the deposition process, and the process gas G (the source gas, the reactive gas, and the auxiliary gas) is continuously supplied into the deposition zone D from the gas supplying portion 5 of the gas supplying device. At the same time, the pressure is adjusted and maintained in such a manner that "pressure PD of deposition zone D (PD=about 0.1 Pa to 10 Pa)≤pressure PE of non-deposition zone E" is established.

Then, when the AC power supply 8 applies the AC voltage of the high frequency or the pulse shape voltage to the deposition rollers 2, 2, the glow discharge is generated from the surfaces of the deposition rollers 2, 2 selectively in spaces in which magnetic fields are formed by the magnetic field generating devices 7, and the process gas G is caused to become the plasma, so as to form the plasma regions P. The process gas G supplied from the gas supplying portion 5 reaches the plasma regions P, and the source gas is decomposed by the plasma, so that the coating is deposited on the substrate W.

Under such a situation, the substrate W fed out from the feeding roll 10 is wound around the left deposition roller 2, 2 and passes through the plasma region P of the left deposition roller 2, and then the moving direction thereof is reversed upside down in the auxiliary roller 12. The substrate W is wound around the right deposition roller 2, passes through the plasma region P of the right deposition roller 2 in which the second deposition is performed, and is taken up by the take-up roll 11.

As described above, in the plasma CVD apparatus 1 of the present invention, the coating can be deposited while conveying the substrate W in such a manner that the substrate passes through the plasma regions P formed on the surfaces of the lower parts of the deposition rollers 2, 2 in a state that the substrate W is stretched over the surfaces of the deposition rollers 2, 2.

Since the electrodes for plasma generation are the pair of deposition rollers 2, 2, a counter electrode for maintaining the discharge is not required. Since a mechanism relating to the plasma generation is only the two deposition rollers 2, 2, a plasma generating mechanism can be formed by the minimum number of rollers.

Since the substrate W always exists in the plasma regions P of the deposition rollers 2, 2, the surfaces of the deposition rollers 2, 2 are not exposed, so that the coating is not deposited on the surfaces of the rollers. Therefore, a change in the discharge caused by the coating deposition on the deposition rollers 2, 2 (the electrodes) is not generated, so that a long-time stable discharge can be realized. Since a specific counter electrode is not required, generation of dust due to a coating flake from the counter electrode is not caused.

A right wall, a left wall, and the bottom wall 3A of the vacuum chamber 3 are exposed in the deposition zone D, and the coating deposition is generated in this part. However, since there is no role as an electrode for generating the plasma unlike a conventional apparatus, installment can be performed while keeping a distance, and a problem due to the deposition is less likely to be generated.

It should be noted that the deposition is unavoidably generated on both ends of the deposition rollers 2, 2. However, even if a deposited substance at the points is scattered as the coating flake, most parts thereof drop downward, and there is almost no contamination due to attachment of the coating flake onto a surface of the substrate on the other roller.

[Second Embodiment]

In place of the plasma CVD apparatus 1 described as the first embodiment, the plasma CVD apparatus 1 in which arrangements of the gas supplying portion 5, the pump systems 6, and the magnetic field generating devices 7 are variously changed can be considered. Those will be described below as a second embodiment. It should be noted that parts whose description is omitted have the substantially same configurations as the plasma CVD apparatus 1 of the first embodiment.

FIGS. 4 to 8 show schematic front views of the plasma CVD apparatus 1 according to the second embodiment.

Figure 4:
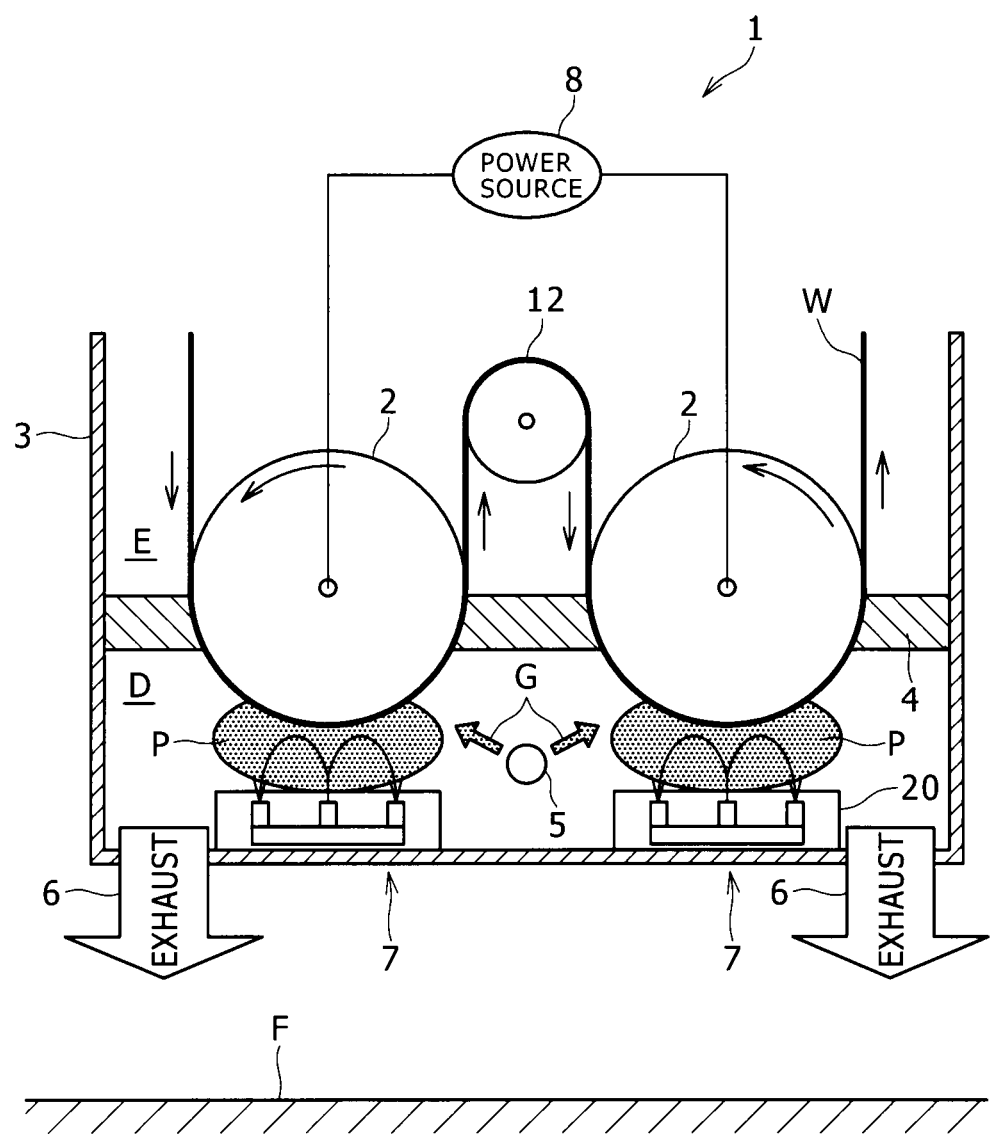
[FIG. 4] A view schematically showing a second embodiment (Example 1) of the plasma CVD apparatus.

FIG. 4 is "Example 1" of the second embodiment. In this plasma CVD apparatus 1, the magnetic field generating devices 7 are provided on the outer side of the deposition rollers 2, 2 at positions facing the surfaces of the lower parts of the deposition rollers 2.

In detail, the magnetic field generating devices 7 are disposed on the lower side of the deposition rollers 2, 2 on the bottom wall 3A of the vacuum chamber 3. A configuration of the magnetic field generating devices 7 is the substantially same as the first embodiment, and the magnetron magnetic field generating mechanism or the like can be adopted. The magnetic field generating devices 7 are preferably disposed on the bottom wall 3A while being surrounded by stainless casings 20 in such a manner that the coating is not deposited on the magnetic field generating devices.

Figure 5:
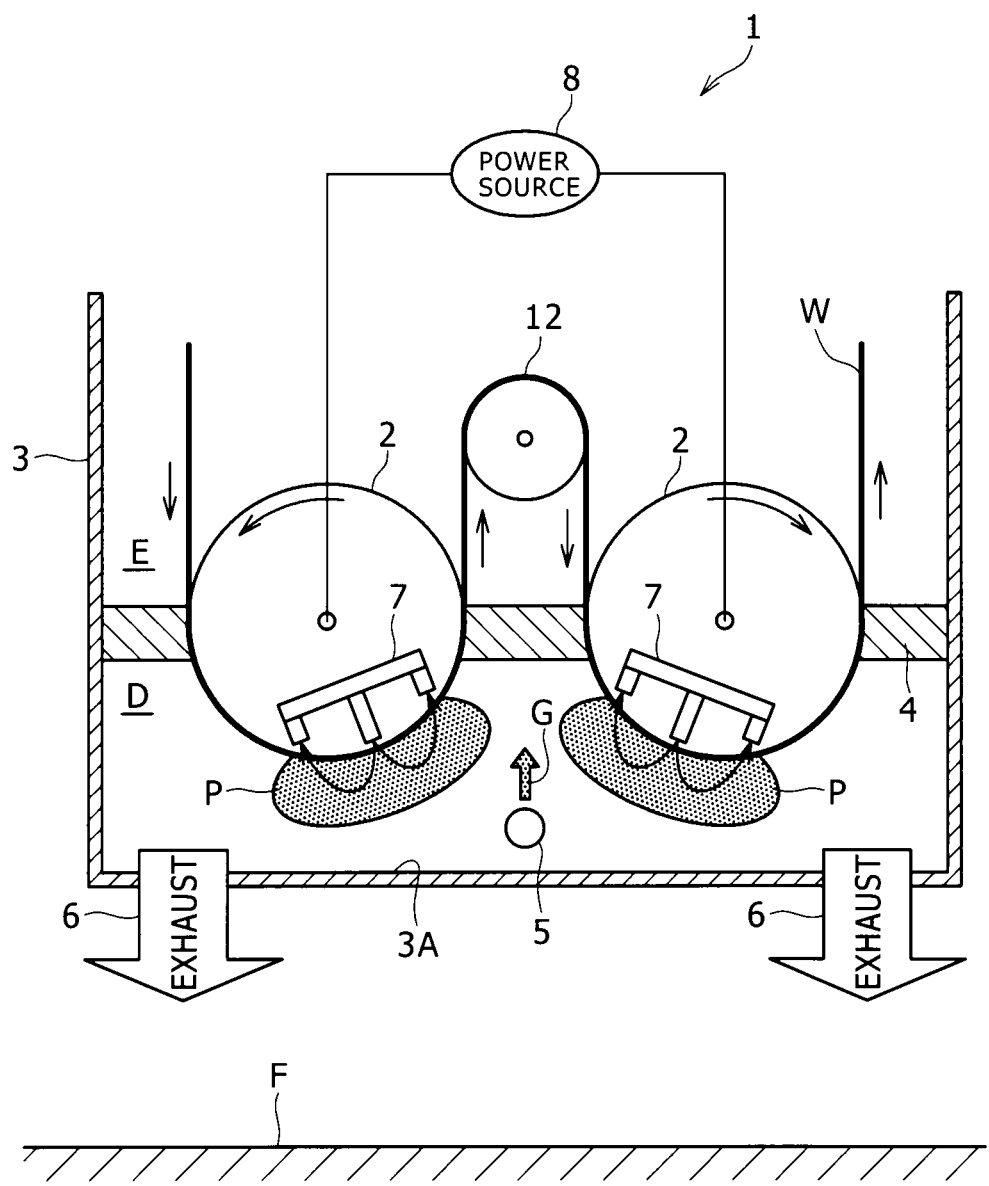
[FIG. 5] A view schematically showing the second embodiment (Example 2) of the plasma CVD apparatus.

FIG. 5 is "Example 2" of the second embodiment. In this plasma CVD apparatus 1, the magnetic field generating devices 7 disposed on the inner side of the deposition rollers 2, 2 are respectively directed obliquely downward in the directions in which the magnetic field generating devices face each other.

In detail, the magnetic field generating device 7 inside the deposition roller 2 positioned on the left side in FIG. 5 is directed right-obliquely downward, and the magnetic field generating device 7 inside the deposition roller 2 positioned on the right side is directed left-obliquely downward. Therefore, the vicinity of the surface of a right-obliquely lower part of the deposition roller 2 positioned on the left side becomes the plasma region P, and the vicinity of the surface of a left-obliquely lower part of the deposition roller 2 positioned on the right side becomes the plasma region P.

The gas supplying portion 5 is arranged between and on the lower side of the pair of deposition rollers 2, 2, and the injection holes of the process gas G are directed substantially vertically upward.

Even with this configuration, the process gas G injected from the gas supplying portion 5 reliably reaches the plasma regions P, so that the coating is deposited on the substrate W. The process gas G after the deposition is exhausted from the pump systems 6 provided at two points on both the left and right sides of the bottom wall 3A of the vacuum chamber 3 to the exterior.

Figure 6:
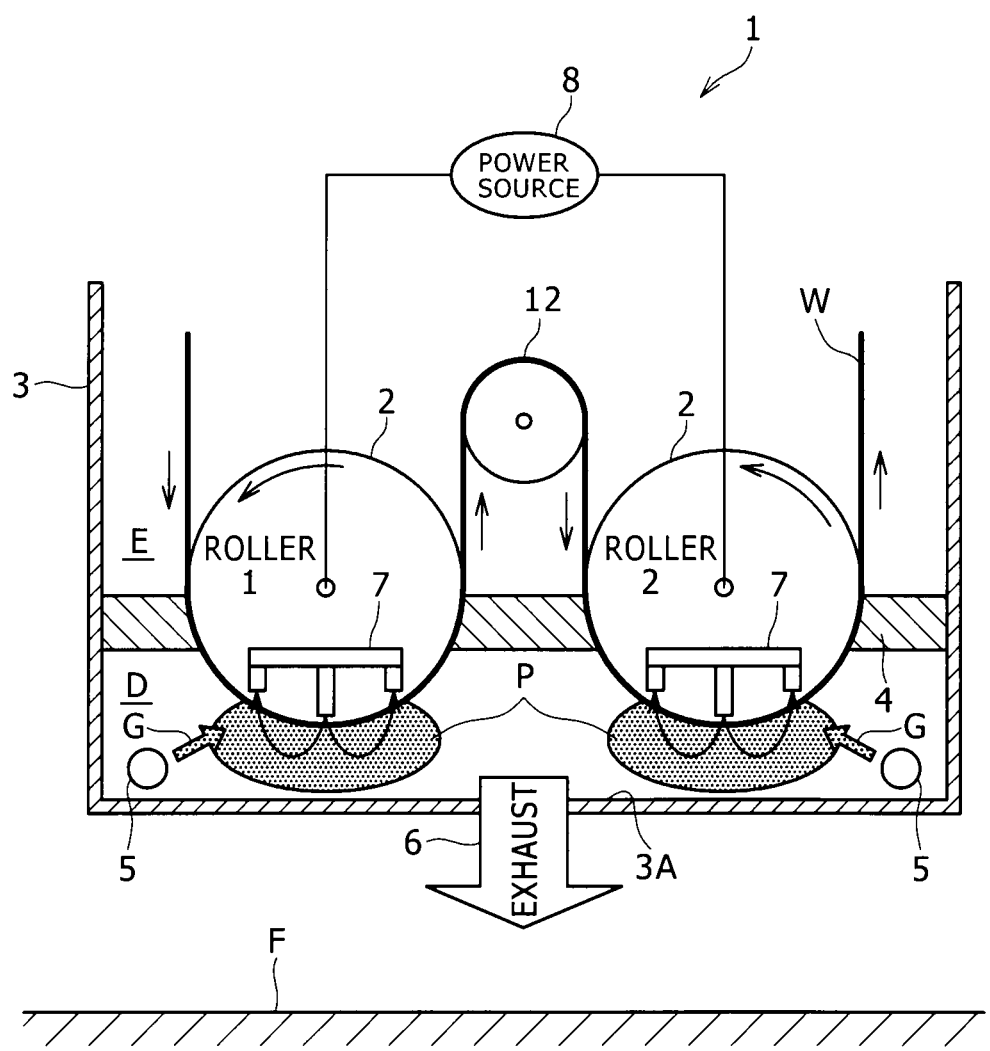
[FIG. 6] A view schematically showing the second embodiment (Example 3) of the plasma CVD apparatus.

FIG. 6 is "Example 3" of the second embodiment. In this plasma CVD apparatus 1, the magnetic field generating devices 7 are provided at positions for forming the plasma regions P on the surfaces of the lower parts of the pair of deposition rollers 2, 2, the gas supplying portions 5 are arranged outside of and on the lower side of the pair of deposition rollers 2, 2, and the pump system 6 is arranged between and on the lower side of the pair of deposition rollers 2, 2.

In detail, as well as the first embodiment, the magnetic field generating devices 7 are disposed on the inner side of the deposition rollers 2, 2 in such a manner that the magnetic poles are directed downward. By the magnetic field generating devices 7, the surfaces of the lower parts of the deposition rollers 2, 2 become the plasma regions P.

Further, the gas supplying portion 5 is arranged on the outer side and on the left-obliquely lower side of the deposition roller 2 positioned on the left side in FIG. 6, and the injection holes of the process gas G are directed right-upward. Another gas supplying portion 5 is also arranged on the outer side and on the right-obliquely lower side of the deposition roller 2 positioned on the right side, and the injection holes of the process gas G of this gas supplying portion 5 are directed left-upward.

The pump system 6 is arranged between and on the lower side of the pair of deposition rollers 2, 2, and the process gas G is exhausted from a center part of the bottom wall 3A of the vacuum chamber 3 to the exterior.

Even with this configuration, the process gas G injected from the gas supplying portions 5 reaches the plasma regions P, so that the coating is deposited on the substrate W.

Figure 7:
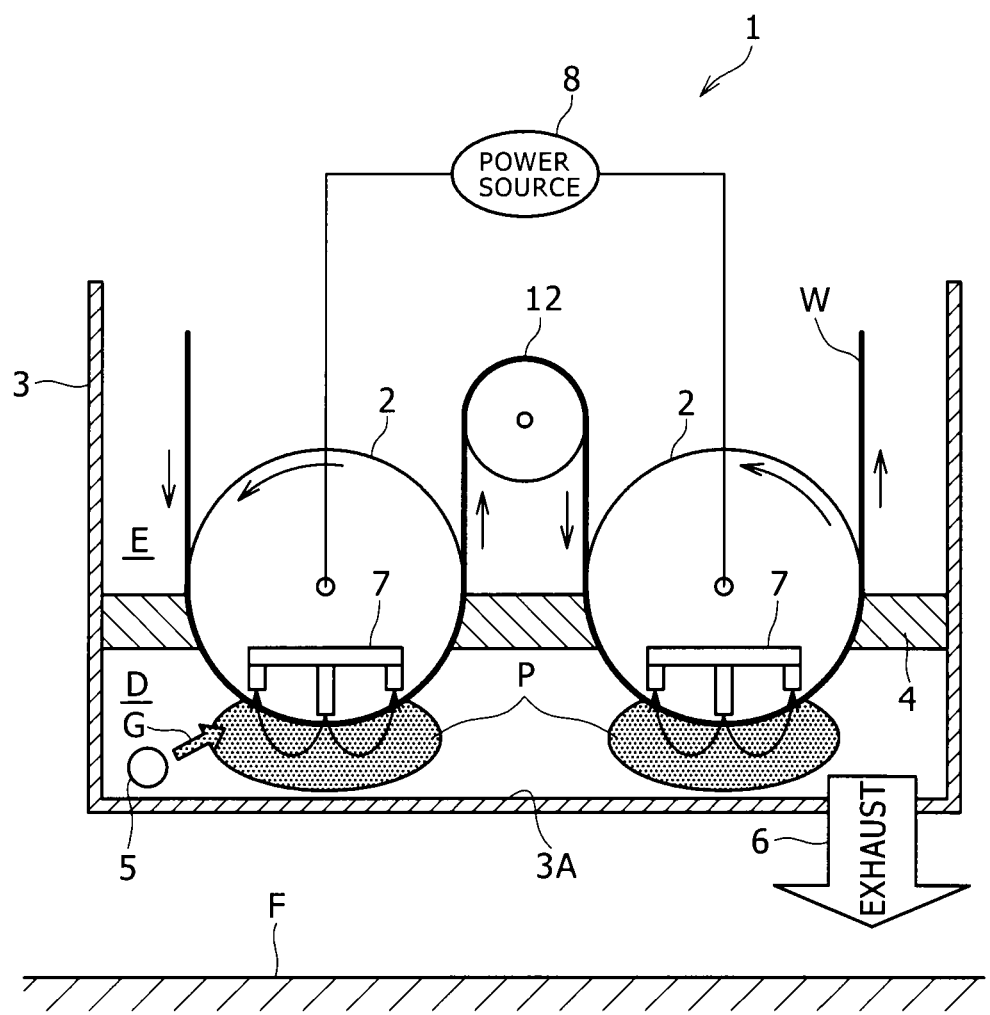
[FIG. 7] A view schematically showing the second embodiment (Example 4) of the plasma CVD apparatus.

FIG. 7 is "Example 4" of the second embodiment. In this plasma CVD apparatus 1, the magnetic field generating devices 7 are provided at the positions for forming the plasma regions P on the surfaces of the lower parts of the pair of deposition rollers 2, 2, the gas supplying portion 5 is arranged on one of the outsides of and on the lower side of the pair of deposition rollers 2, 2, and the pump system 6 is arranged on the other outside of and on the lower side of the pair of deposition rollers 2, 2.

In detail, as well as the first embodiment, the magnetic field generating devices 7 are disposed inside the deposition rollers 2, 2 in such a manner that the magnetic poles are directed downward. By the magnetic field generating devices 7, the surfaces of the lower parts of the deposition rollers 2, 2 become the plasma regions P.

Further, the gas supplying portion 5 is arranged on the outer side and on the left-obliquely lower side of the deposition roller 2 positioned on the left side in FIG. 7, and the injection holes of the process gas G are directed right-upward. The pump system 6 is arranged on the outer side and on the right-obliquely lower side of the deposition roller 2 positioned on the right side, and the process gas G is exhausted from a right part of the bottom wall 3A of the vacuum chamber 3 to the exterior.

Even with this configuration, the process gas G injected from the gas supplying portion 5 reaches the plasma regions P, so that the coating is deposited on the substrate W. In addition, the source gas supplied from one side of the deposition rollers 2, 2 (the left side of the left deposition roller 2 in the present embodiment) passes through the two plasma regions P and is utilized for the deposition, and then exhausted from the other side (the right side of the right deposition roller 2 in the present embodiment), so as to be utilized more efficiently.

Figure 8:
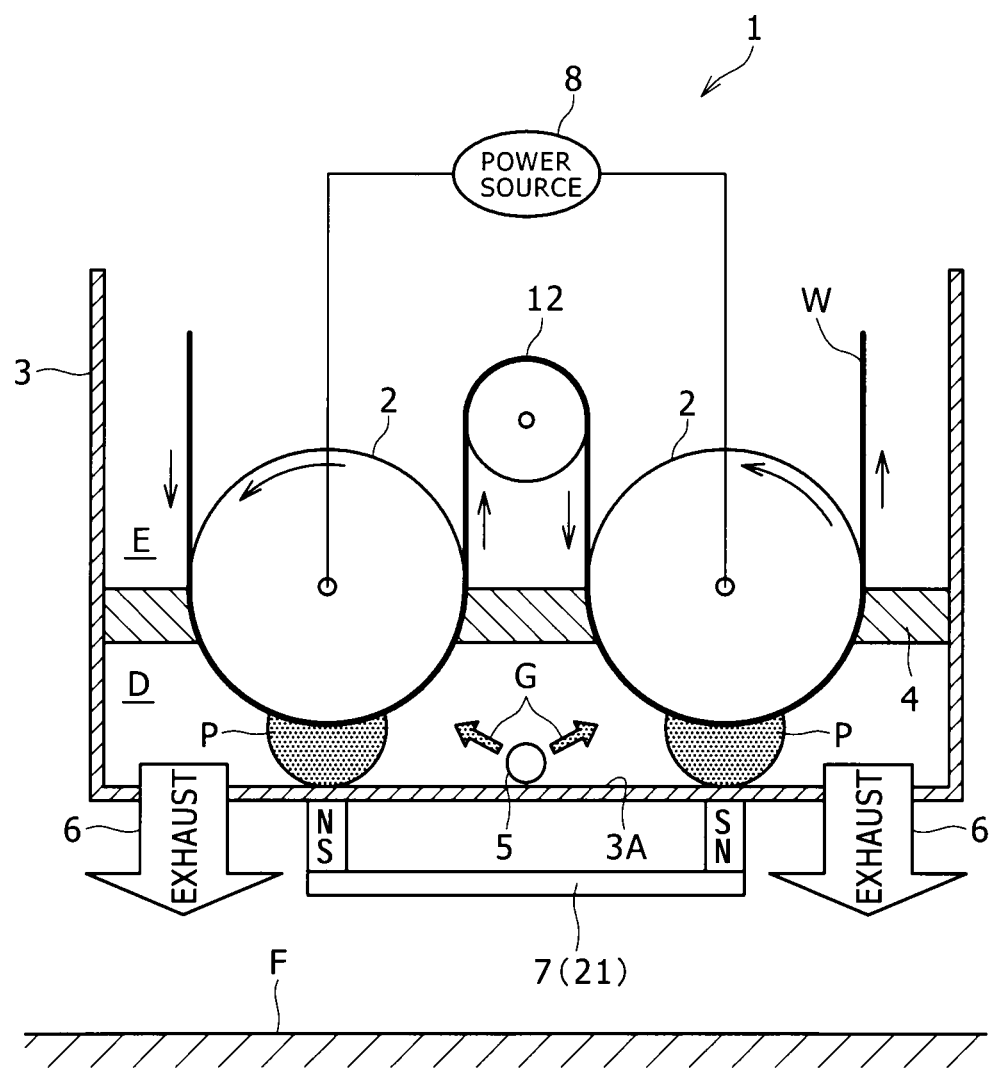
[FIG. 8] A view schematically showing the second embodiment (Example 5) of the plasma CVD apparatus.

FIG. 8 is "Example 5" of the second embodiment serving as a modified example of "Example 1" described above.

In this example, the magnetic field generating device 7 is provided on the outer side of the vacuum chamber 3 at a position facing the surfaces of the lower parts of the deposition rollers 2, 2.

As shown in FIG. 8, the magnetic field generating device 7 may be arranged on the outer side of the vacuum chamber 3. In this case, the magnetic field generating device 7 is arranged at a position for generating the magnetic fields for confining the plasma in the vicinity of the parts of the surfaces of the pair of deposition rollers 2, 2 positioned in the deposition zone D. In FIG. 8, a mirror magnetic field generating mechanism 21 is used as the magnetic field generating device 7. However, the substantially same magnetron magnetic field generating mechanism as the first embodiment or the like may be used. When this configuration is adopted, there is no need for surrounding the magnetic field generating device 7 itself by the casing 20, so that the number of parts can be reduced and an apparatus configuration can be simplified.

In all Examples 1 to 5 described above, the gas supplying portion 5 and the pump systems 6 are arranged on the lower side of the plasma regions P in which the coating is deposited on the substrate W. Therefore, even when the coating deposited on the gas supplying portion 5 and/or the pump systems 6 is peeled off, the coating flake does not reach the surface of the substrate W positioned on the upper side, so that the attachment to the substrate W and the contamination can be prevented.

[Third Embodiment]

Next, a third embodiment of the plasma CVD apparatus according to the present invention will be described.

Figure 9:
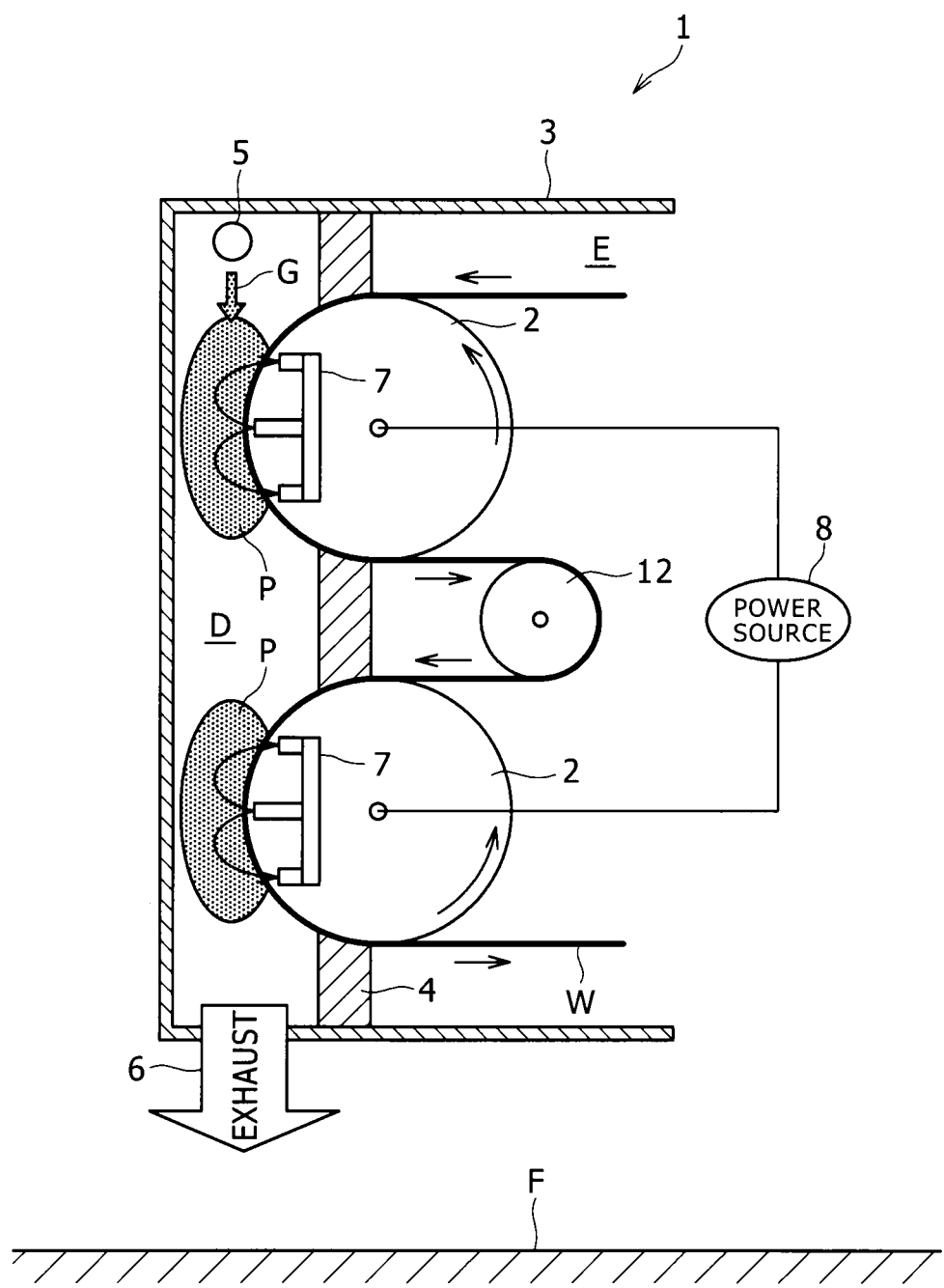
[FIG. 9] A view schematically showing a third embodiment of the plasma CVD apparatus.

The plasma CVD apparatus 1 of the present embodiment shown in FIG. 9 is different from the plasma CVD apparatus of the first embodiment in a point that the pair of deposition rollers 2, 2 is disposed in such a manner that the axes thereof are parallel to each other side by side in the substantially vertical direction to the floor surface F. The deposition zone D is provided on the left side of the line connecting the rotation centers of the pair of deposition rollers 2, 2. When the plasma CVD apparatus of the first embodiment and the second embodiment is regarded as a horizontal type, the plasma CVD apparatus 1 of the present embodiment is regarded as a vertical type.

As shown in FIG. 9, the blocking member 4 partitioning the interior of the vacuum chamber 3 into the left and right sides is provided on the slightly left side of the line connecting the rotation centers of the pair of deposition rollers 2, 2. The blocking member 4 is provided in the vertical direction in the vacuum chamber 3 so as to lie at a position on the left side of the rotation centers of the deposition rollers 2, 2.

In the vacuum chamber 3, the left side of this blocking member 4 is the deposition zone D in which the coating is deposited, and the right side of the blocking member 4 is the non-deposition zone E not contributing to the deposition.

The magnetic field generating devices 7 are disposed inside the deposition rollers 2, 2 in such a manner that the plasma regions P are formed on left surfaces of the deposition rollers 2, 2. The magnetic poles are directed leftward in such a manner that the magnetic lines generated from the magnetic field generating devices 7 reach from inner surfaces of left parts of the deposition rollers 2, 2 to outer surfaces of the left parts (the left surfaces) and return to the inner sides of the deposition rollers 2, 2 again.

The feeding roll 10 is disposed on the upper right side in the vacuum chamber 3, and the take-up roll 11 is disposed on the lower right side in the vacuum chamber 3. That is, the feeding roll 10 and the take-up roll 11 are provided in the non-deposition zone E. One auxiliary roller 12 is provided between and on the right side of the pair of upper and lower deposition rollers 2, 2 (the non-deposition zone E).

The gas supplying portion 5 is disposed in the deposition zone D on the further upper side of the upper deposition roller 2. Specifically, the gas supplying portion 5 serving as a circular pipe member is disposed in such a manner that the axis thereof and the rotation axes of the deposition rollers 2, 2 are substantially parallel to each other. The injection holes provided along the longitudinal direction of the gas supplying portion 5 are opened downward so as to point to the plasma regions P. The pump system 6 is provided in the deposition zone D on the further lower side of the lower deposition roller 2.

Even with this configuration, the process gas G injected from the gas supplying portion 5 reaches the plasma regions P, so that the coating is deposited on the substrate W. In addition, the source gas supplied from the upper side of the deposition rollers 2, 2 passes through the two plasma regions P and after the coating deposition, is exhausted from the lower side. Thereby, the source gas can be utilized efficiently.

The embodiments disclosed herein are not limitations but examples in all respects. The scope of the present invention is indicated by the claims and includes equal meanings to the claims and all modifications within the claims.

For example, the embodiments describe that the line connecting the rotation centers of the pair of horizontal type deposition rollers 2, 2 is horizontal in the apparatus of the first embodiment and the second embodiment, and the line connecting the rotation centers of the pair of vertical type deposition rollers 2, 2 is vertical in the apparatus of the third embodiment. The terms "horizontal" and "vertical" in such embodiments are not limited to horizontal and vertical states in a strict sense but indicate substantially horizontal and vertical states.

An example will be shown. In the plasma CVD apparatus 1 of the first embodiment, even when the line connecting the rotation centers of the pair of deposition rollers 2, 2 is inclined by about 5° to 10° relative to the floor surface F, the plasma CVD apparatus is intended to be included within the claims of the present application.

A mode in which one continuous film (the substrate W) successively passes through the pair of deposition rollers 2, 2 is shown in the above first to third embodiments. However, a feeding portion (the feeding roll 10) and a take-up portion (the take-up roll 11) can be provided for each of the pair of deposition rollers 2, 2, and such a mode is within the scope of the present invention. In this case, the auxiliary roller 12 is not required.

The present invention described above is summarized as follows.

That is, a plasma CVD apparatus according to the present invention is a plasma CVD apparatus for depositing a coating on a surface of a sheet shape substrate, including a vacuum chamber, a pair of deposition rollers disposed in the vacuum chamber and connected to both electrodes of an AC power supply, the deposition rollers around which the substrate is wound, a gas supplying device for supplying a gas containing a source gas to a deposition zone serving as one part of or all of a region on one side of a line connecting rotation centers of the pair of deposition rollers, and a magnetic field generating device for generating magnetic fields in which plasma of the source gas is generated in a predetermined region by applying the AC voltage to each of the deposition rollers from the AC power supply, wherein the magnetic field generating device causes the source gas in regions adjacent to surfaces of parts of the pair of deposition rollers positioned in the deposition zone to become the plasma so as to form plasma regions, and the substrate is wound around the pair of deposition rollers so as to pass through the plasma regions. It should be noted that the gas is formed by mixing the source gas forming the coating and serving as an essential with a reactive gas reacting with the source gas so as to form a chemical compound and an auxiliary gas not being contained in the coating but contributing to plasma generation, coating quality improvement, and the like, if necessary.

According to this plasma CVD apparatus, the counter electrode does not exist around the deposition rollers. Thus, a change in a characteristic of the discharge caused by the deposition on the counter electrode is suppressed, and the coating flake is not generated.

Moreover, since the deposition zone is formed in the region on the one side of the line connecting the rotation centers of the pair of deposition rollers arranged in parallel, the coating flake scattered from one of the deposition rollers does not easily reach the film on the other deposition roller. Specifically, since the deposition zone is formed in the region on the one side of the line connecting the rotation centers, in comparison to a case where plasma regions are respectively formed at facing positions of the surfaces of the deposition rollers, a distance between the plasma regions formed on the surfaces of the deposition rollers is increased, and deposition surfaces of the film are not placed at the facing positions. Therefore, even when the coating flake is scattered from one of the deposition rollers, the coating flake does not easily reach the film on the other deposition roller in comparison to a case where the plasma is generated at the facing positions of the deposition rollers. Thereby, generation of contamination due to scatter of the coating flake can be suppressed.

Alternatively, the pair of deposition rollers may be disposed in such a manner that axes thereof are parallel to each other side by side in the horizontal direction, and the deposition zone may serve as one part of or all of a region on the lower side of the line connecting the rotation centers of the pair of deposition rollers. With this configuration, even when coating flake is caused and the coating deposited on both ends of the deposition rollers (parts around which the substrate is not wound) is peeled off, the coating drops downward. Thus, the attachment of such flakes to the substrate and the contamination can be avoided.

Alternatively, a blocking member partitioning an interior of the vacuum chamber into a non-deposition zone serving as a region on the upper side of the deposition zone and the deposition zone may be provided. With this configuration, the non-deposition zone and the deposition zone are always partitioned, and both the zones are reliably blocked. By the blocking member, the inflow of the gas supplied to the deposition zone to the non-deposition zone is suppressed, so that the deposition in the non-deposition zone is prevented.

In this case, a feeding roll and a take-up roll for the substrate may be disposed in the non-deposition zone, and the blocking member may have a lower surface facing the deposition zone, and be provided in such a manner that the lower surface is placed on the lower side of the line connecting the rotation centers of the pair of deposition rollers. With this configuration, the substrate fed out from the feeding roll or the substrate taken up by the take-up roll is wound around the deposition rollers in regions on the lower side of the rotation axes of the deposition rollers, and the upper side surfaces of the deposition rollers is exposed. However, the blocking member is provided in the vacuum chamber in such a manner that the lower surface of the blocking member is placed on the lower side of the line connecting the rotation centers of the pair of deposition rollers. Thus, the exposed upper surfaces of the deposition rollers are reliably positioned in the non-deposition zone. As a result, the deposition on the deposition rollers can be prevented.

Alternatively, a clearance capable of causing the substrate to pass through and suppressing inflow of the source gas from the deposition zone to the non-deposition zone may be formed between the blocking member and each of the deposition rollers. With this configuration, while the inflow of the source gas from the deposition zone to the non-deposition zone is suppressed, the substrate is moved between both the zones without any troubles.

Alternatively, a non-deposition zone side gas supplying device for supplying a reactive gas and/or an auxiliary gas to the non-deposition zone may be provided, and the non-deposition zone side gas supplying device may supply the reactive gas and/or the auxiliary gas in such a manner that pressure of the non-deposition zone is equal to or higher than pressure of the deposition zone in order to suppress the inflow of the source gas to the non-deposition zone. With this configuration, the inflow of the source gas supplied to the deposition zone to the non-deposition zone is reliably prevented, and a partitioning and blocking state of both the zones is reliably provided.

Alternatively, a pump system for exhausting the deposition zone may be provided, the magnetic field generating device may be provided at positions where the plasma regions are formed in regions adjacent to surfaces of lower parts of the pair of deposition rollers, the gas supplying device may be arranged between and on the lower side of the pair of deposition rollers, and the pump system may be arranged outside of and on the lower side of the pair of deposition rollers. Alternatively, a pump system for exhausting the deposition zone may be provided, the magnetic field generating device may be provided at positions where the plasma regions are formed in regions adjacent to surfaces of lower parts of the pair of deposition rollers, the gas supplying device may be arranged outside of and on the lower side of the pair of deposition rollers, and the pump system may be arranged between and on the lower side of the pair of deposition rollers.

With any of the configurations, the gas supplying device and the pump system are arranged on the lower side of the plasma regions in which the coating is deposited on the substrate. Thus, even when the coating deposited on the gas supplying device and/or the pump system is peeled off, the coating flakes do not reach the substrate positioned on the upper side, so that the attachment of such flakes to the substrate and the contamination can be prevented. Moreover, exhaust is performed from the pump system positioned on the lower side of the plasma regions (in other words, not from the non-deposition zone but from the deposition zone). Thus, a possibility that the peeled-off coating flake reaches the plasma regions in which the coating is deposited is reduced.

Alternatively, a pump system for exhausting the deposition zone may be provided, the magnetic field generating device may be provided at positions where the plasma regions are formed in surfaces of lower parts of the pair of deposition rollers, the gas supplying device may be arranged on one of the outsides of and on the lower side of the pair of deposition rollers, and the pump system may be arranged on the other outside of and on the lower side of the pair of deposition rollers. With this configuration, the gas supplying device and the pump system are arranged on the lower side of the plasma regions in which the coating is deposited on the substrate. Thus, even when the coating deposited on the gas supplying device and/or the pump system is peeled off, the coating flakes do not reach the substrate positioned on the upper side, so that the attachment of such flakes to the substrate and the contamination can be prevented. In addition, the source gas supplied from one of the left and right sides of the deposition rollers passes through the two plasma regions and after the deposition, is exhausted from the other left or right side. Thus, the source gas can be utilized efficiently.

Alternatively, one auxiliary roller for guiding the substrate passing through one of the deposition rollers to the other deposition roller may be disposed between the pair of deposition rollers in the non-deposition zone. With this configuration, the substrate passing through one of the deposition rollers can be guided to the other deposition roller. Alternatively, since the auxiliary roller for changing the direction of the substrate is disposed in the non-deposition zone, the coating is not deposited on a surface of the auxiliary roller and does not contaminate the substrate whose direction is converted.

In the plasma CVD apparatus disclosed in Patent Document 3, two auxiliary rollers are arranged in upper parts of the pair of deposition rollers for a purpose of extending length of the substrate closely attached to the deposition rollers in the space where the pair of deposition rollers faces each other, or the like. However, by adopting the configuration of the present invention, while winding the substrate around surfaces on the lower side of rotation axes of the deposition rollers (while extending the length of the substrate), the number of the auxiliary roller can be reduced to one. Reduction of the installing number of the auxiliary roller is led to reduction of members on which the coating is deposited, and is advantageous for suppressing a surface defect of the substrate.

INDUSTRIAL APPLICABILITY

As described above, the plasma CVD apparatus according to the present invention is useful for a plasma CVD apparatus for continuously depositing the functional coating on the surface of the sheet shape substrate such as a plastic film, and suitable for minimizing generation of the coating defect on the substrate due to the coating flakes even when the coating flakes are generated by the peeling-off of the coating deposited on the members other than the substrate.

The invention claimed is:
1. A plasma CVD apparatus for depositing a coating on a surface of a sheet shape continuous substrate, comprising:
   a vacuum chamber;
   a pair of deposition rollers disposed in said vacuum chamber and connected to both poles of an AC power supply, the deposition rollers around which the substrate is wound;

a gas supplying device for supplying a gas containing a source gas to a deposition zone serving as one part of or all of a region on one side of a line connecting rotation centers of said pair of deposition rollers; and a magnetic field generating device provided at a location relative to each of said deposition rollers to generate magnetic fields in which plasma of the source gas is generated in a predetermined region including surfaces of the deposition rollers in the deposition zone by applying an AC voltage to each of said deposition rollers from the AC power supply, wherein said magnetic field generating device causes the source gas in regions adjacent to surfaces of parts of said pair of deposition rollers positioned in the deposition zone to become the plasma so as to form plasma regions, and the substrate is wound around said pair of deposition rollers so as to pass through the plasma regions.

2. The plasma CVD apparatus according to claim 1, wherein said pair of deposition rollers is disposed in such a manner that axes thereof are parallel to each other side by side in the horizontal direction, and the deposition zone serves as one part of or all of a region on the lower side of the line connecting the rotation centers of said pair of deposition rollers.

3. The plasma CVD apparatus according to claim 2, comprising:
a blocking member partitioning an interior of said vacuum chamber into a non-deposition zone serving as a region on the upper side of the deposition zone and the deposition zone.

4. The plasma CVD apparatus according to claim 3, wherein a feeding roll and a take-up roll for the substrate are disposed in the non-deposition zone, and said blocking member has a lower surface facing the deposition zone, and is provided in such a manner that the lower surface is placed on the lower side of the line connecting the rotation centers of said pair of deposition rollers.

5. The plasma CVD apparatus according to claim 3, wherein a clearance capable of causing the substrate to pass through and suppressing inflow of the source gas from the deposition zone to the non-deposition zone is formed between said blocking member and each of said deposition rollers.

6. The plasma CVD apparatus according to claim 5, comprising:
a non-deposition zone side gas supplying device for supplying a reactive gas and/or an auxiliary gas to the non-deposition zone, wherein said non-deposition zone side gas supplying device supplies the reactive gas and/or the auxiliary gas in such a manner that pressure of the non-deposition zone is equal to or higher than pressure of the deposition zone in order to suppress the inflow of the source gas to the non-deposition zone.

7. A plasma CVD apparatus for depositing a coating on a surface of a sheet shape continuous substrate, comprising:
a vacuum chamber;
a pair of deposition rollers disposed in said vacuum chamber and connected to both poles of an AC power supply, the deposition rollers around which the substrate is wound;
a gas supplying device for supplying a gas containing a source gas to a deposition zone serving as one part of or all of a region on one side of a line connecting rotation centers of said pair of deposition rollers; and
a magnetic field generating device for generating magnetic fields in which plasma of the source gas is generated in a predetermined region by applying an AC voltage to each of said deposition rollers from the AC power supply, wherein said magnetic field generating device causes the source gas in regions adjacent to surfaces of parts of said pair of deposition rollers positioned in the deposition zone to become the plasma so as to form plasma regions, and the substrate is wound around said pair of deposition rollers so as to pass through the plasma regions, wherein said pair of deposition rollers is disposed in such a manner that axes thereof are parallel to each other side by side in the horizontal direction, and the deposition zone serves as one part of or all of a region on the lower side of the line connecting the rotation centers of said pair of deposition rollers, further comprising a pump system for exhausting the deposition zone, wherein said magnetic field generating device is provided at positions where the plasma regions are formed in regions adjacent to surfaces of lower parts of said pair of deposition rollers, said gas supplying device is arranged between and on the lower side of said pair of deposition rollers, and said pump system is arranged outside of and on the lower side of said pair of deposition rollers.

8. A plasma CVD apparatus for depositing a coating on a surface of a sheet shape continuous substrate, comprising:
a vacuum chamber;
a pair of deposition rollers disposed in said vacuum chamber and connected to both poles of an AC power supply, the deposition rollers around which the substrate is wound;
a gas supplying device for supplying a gas containing a source gas to a deposition zone serving as one part of or all of a region on one side of a line connecting rotation centers of said pair of deposition rollers; and
a magnetic field generating device for generating magnetic fields in which plasma of the source gas is generated in a predetermined region by applying an AC voltage to each of said deposition rollers from the AC power supply, wherein said magnetic field generating device causes the source gas in regions adjacent to surfaces of parts of said pair of deposition rollers positioned in the deposition zone to become the plasma so as to form plasma regions, and the substrate is wound around said pair of deposition rollers so as to pass through the plasma regions, wherein said pair of deposition rollers is disposed in such a manner that axes thereof are parallel to each other side by side in the horizontal direction, and the deposition zone serves as one part of or all of a region on the lower side of the line connecting the rotation centers of said pair of deposition rollers, further comprising a pump system for exhausting the deposition zone, wherein said magnetic field generating device is provided at positions where the plasma regions are formed in regions adjacent to surfaces of lower parts of said pair of deposition rollers, said gas supplying device is arranged outside of and on the lower side of said pair of deposition rollers, and said pump system is arranged between and on the lower side of said pair of deposition rollers.

9. A plasma CVD apparatus for depositing a coating on a surface of a sheet shape continuous substrate, comprising:
- a vacuum chamber;
- a pair of deposition rollers disposed in said vacuum chamber and connected to both poles of an AC power supply, the deposition rollers around which the substrate is wound;
- a gas supplying device for supplying a gas containing a source gas to a deposition zone serving as one part of or all of a region on one side of a line connecting rotation centers of said pair of deposition rollers; and
- a magnetic field generating device for generating magnetic fields in which plasma of the source gas is generated in a predetermined region by applying an AC voltage to each of said deposition rollers from the AC power supply,
- wherein said magnetic field generating device causes the source gas in regions adjacent to surfaces of parts of said pair of deposition rollers positioned in the deposition zone to become the plasma so as to form plasma regions, and the substrate is wound around said pair of deposition rollers so as to pass through the plasma regions,
- wherein said pair of deposition rollers is disposed in such a manner that axes thereof are parallel to each other side by side in the horizontal direction, and the deposition zone serves as one part of or all of a region on the lower side of the line connecting the rotation centers of said pair of deposition rollers, further comprising a pump system for exhausting the deposition zone, wherein said magnetic field generating device is provided at positions where the plasma regions are formed in surfaces of lower parts of said pair of deposition rollers, said gas supplying device is arranged on one of the outsides of and on the lower side of said pair of deposition rollers, and said pump system is arranged on the other outside of and on the lower side of said pair of deposition rollers.

10. The plasma CVD apparatus according to claim 3, wherein one auxiliary roller for feeding the substrate passing through one of said deposition rollers to the other deposition roller is disposed between said pair of deposition rollers in the non-deposition zone.

11. The plasma CVD apparatus according to claim 1, wherein the magnetic field generating device is provided inside each of said deposition rollers.

12. The plasma CVD apparatus according to claim 1, wherein the magnetic field generating device is provided entirely inside each of said deposition rollers.

13. The plasma CVD apparatus according to claim 1, wherein the substrate is wound around said pair of deposition rollers over the entire circumferential extent of the surfaces of the deposition rollers in the deposition zone.

* * * * *